United States Patent
Chinda et al.

(10) Patent No.: US 6,993,066 B2
(45) Date of Patent: Jan. 31, 2006

(54) TRANSMITTING APPARATUS AND GAIN COMPENSATING METHOD

(75) Inventors: Yusuke Chinda, Yokosuka (JP); Katsuhiko Hiramatsu, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 835 days.

(21) Appl. No.: 09/959,579

(22) PCT Filed: Mar. 8, 2001

(86) PCT No.: PCT/JP01/01805

§ 371 (c)(1),
(2), (4) Date: Oct. 30, 2001

(87) PCT Pub. No.: WO01/69827

PCT Pub. Date: Sep. 20, 2000

(65) Prior Publication Data
US 2002/0159504 A1    Oct. 31, 2002

(30) Foreign Application Priority Data
Mar. 13, 2000    (JP)    ............................. 2000-068428

(51) Int. Cl.
H04B 1/69     (2006.01)
H04J 13/02    (2006.01)

(52) U.S. Cl. ..................... 375/147; 375/146; 370/342

(58) Field of Classification Search ................ 375/146, 375/247, 219, 297, 147; 330/279; 455/126, 455/127.2; 370/342

See application file for complete search history.

(56) References Cited

U.S. PATENT DOCUMENTS

| 5,116,525 | A | * | 5/1992 | Merchant | 455/127.2 |
| 5,684,833 | A | * | 11/1997 | Watanabe | 375/286 |
| 5,903,523 | A | * | 5/1999 | Peck | 455/126 |
| 5,910,182 | A | * | 6/1999 | Dent et al. | 714/786 |
| 5,987,307 | A | * | 11/1999 | Buskirk et al. | 455/73 |

(Continued)

FOREIGN PATENT DOCUMENTS

JP    03154430    7/1991

(Continued)

OTHER PUBLICATIONS

Kazuyuki Miya, et al., "A Base-Station Diversity Scheme for CDMA/TDD System", technical Report of IEICE, RCS94-73, Sep. 17, 1994, pp. 25-30.

Primary Examiner—Emmanuel Bayard
Assistant Examiner—Lawrence B. Williams
(74) Attorney, Agent, or Firm—Stevens, Davis, Miller & Mosher, LLP

(57) ABSTRACT

A code multiplexer multiplexes spread data output from a spreader to generate code-multiplexed data. A reference data generator generates redundant data with constant power and with no information contained therein. A data adder adds the redundant data to the code-multiplexed data. A variable amplifier variably amplifies the transmit power of the code-multiplexed data and the redundant data to obtain transmit output data. A difference value calculator calculates a difference value between a target amplitude value and the amplitude of the amplified redundant data. A gain controller generates, based on the difference value, a gain control signal to control the gain of the variable amplifier. It is thereby possible to perform gain compensation with a small calculation amount and with high accuracy.

6 Claims, 3 Drawing Sheets

U.S. PATENT DOCUMENTS

| | | | |
|---|---|---|---|
| 6,118,987 A * | 9/2000 | Hiramatsu et al. | 455/108 |
| 6,272,125 B1 * | 8/2001 | Nomura | 370/342 |
| 6,512,917 B1 * | 1/2003 | Hiramatsu | 455/69 |
| 6,522,639 B1 * | 2/2003 | Kitade et al. | 370/335 |
| 6,597,922 B1 * | 7/2003 | Ling et al. | 455/522 |
| 6,651,211 B1 * | 11/2003 | Abe et al. | 714/762 |
| 6,795,488 B1 * | 9/2004 | Iwakiri | 375/148 |

FOREIGN PATENT DOCUMENTS

| | | |
|---|---|---|
| JP | 07015262 | 1/1995 |
| JP | 08116343 | 5/1996 |
| JP | 11027233 | 1/1999 |
| JP | 11308126 | 11/1999 |

* cited by examiner

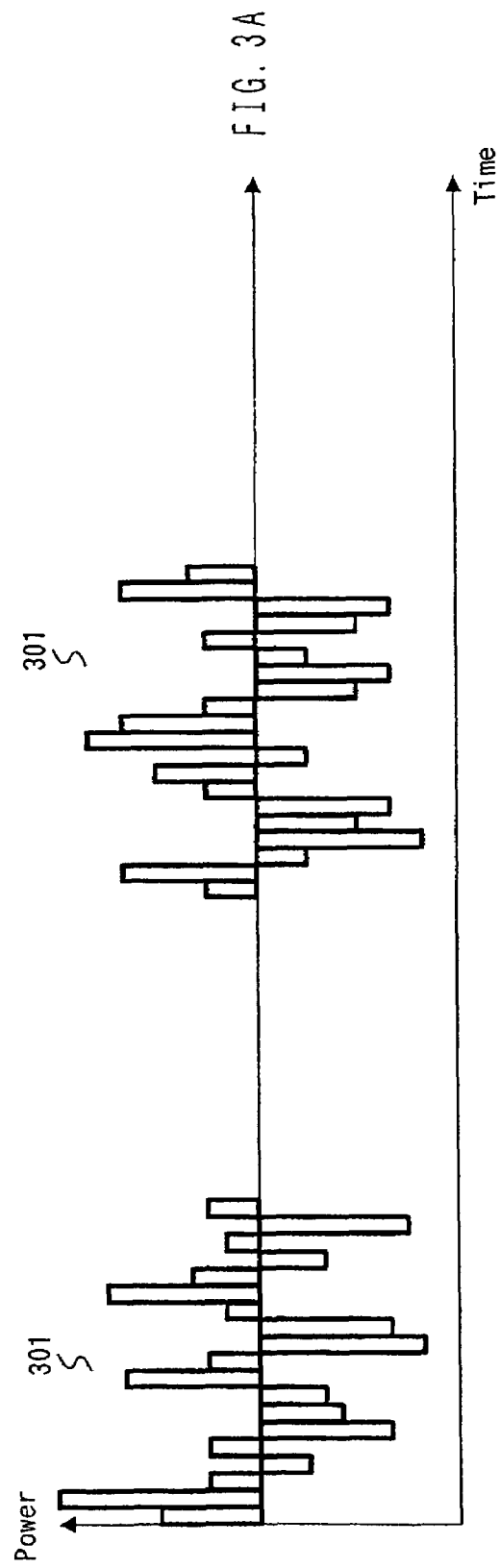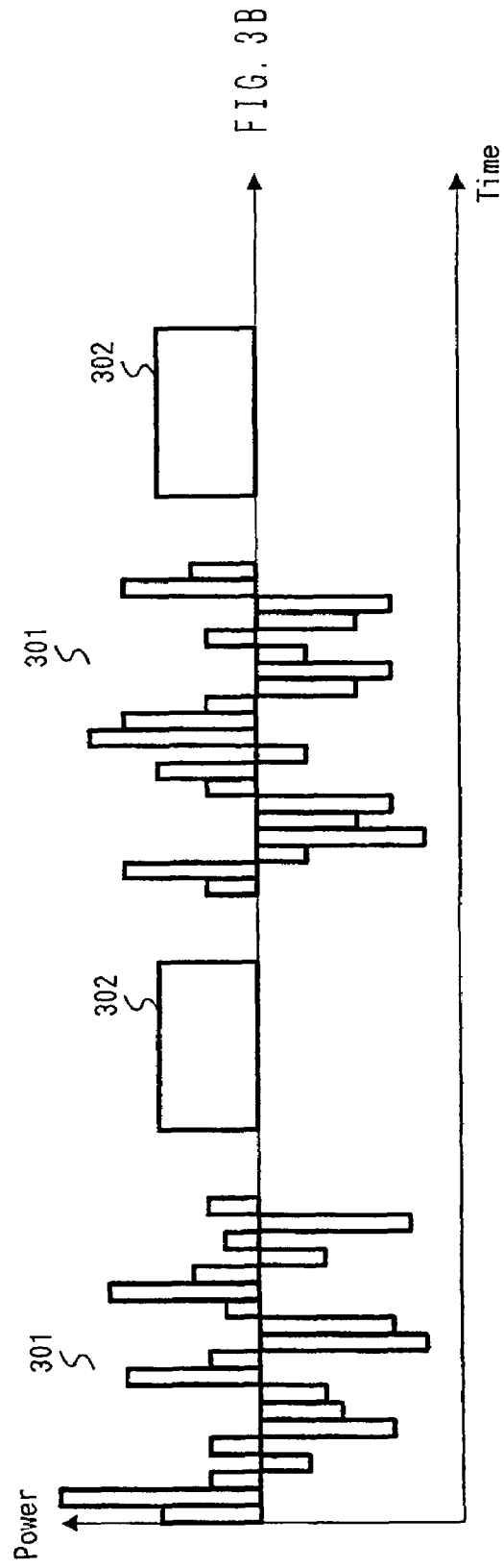

TRANSMITTING APPARATUS AND GAIN COMPENSATING METHOD

This application is a 371 of PCT/JP01/01805 Mar. 8, 2001.

TECHNICAL FIELD

The present invention relates to a transmission apparatus and gain compensation method for performing a compensation of an amplification gain of transmit power in a CDMA (Code Division Multiple Access) radio communication system.

BACKGROUND ART

A transmit amplifier has a problem that the gain deteriorates due to changes in temperature and changes with time. The characteristic deterioration caused by the changes in temperature is improved by installing a temperature-dependent characteristic changing element on a circuit such as a thermistor as a representative example.

Further, in order to cope with the changes with time, the amplification gain of the transmit power is compensated using a variable gain amplifier or variable attenuator installed on a signal processing line.

As disclosed in Japanese Laid-Open Patent Publication HEI11-27233, a conventional transmission apparatus uses as a reference signal a signal generated by converting a modulated signal into a signal with a transmit frequency, compares a level of the reference signal with a transmit power level, and controls the amplification gain so that both power levels are matched with each other.

FIG. 1 is a block diagram illustrating a configuration of the conventional transmission apparatus. In the apparatus, respective transmit data is spread in spreading sections 11-1 to 11-$n$ (n: natural number), and is multiplexed in a code multiplexing section 12. The multiplexed transmit data is rectified with a root-Nyquist filter 13, the resultant digital signal is converted into an analog signal in a D/A conversion section 14, and the analog signal is amplified in a variable amplifying section 15 so as to provide transmit output data. The transmit output data is distributed in a distributor 16 to be transmitted to communication partners and provided to a detection section 17 for detection. The detected analog signal is converted into a digital signal in an A/D conversion section 18.

Difference value calculating section 19 calculates an output average value resulting from averaging amplitude values of transmit output data, which is the converted digital signal, accumulated during a predetermined period of time, and also calculates average value information resulting from averaging amplitude values of code-multiplexed transmit data accumulated during a predetermined period of time. Difference value calculating section 19 further calculates a difference value between a target amplitude value based on the average value information and the output average value. The transmit output data or code-multiplexed transmit data is averaged because the amplitude values are not constant with time.

Gain control section 20 generates based on the difference value a gain control signal for controlling variable amplifying section 15 so that the output average value is equal to the target amplitude value. The gain control signal is converted from the digital signal to the analog signal in D/A conversion section 21, and the analog signal is output to variable amplifying section 15.

Thus, the conventional transmission apparatus controls variable amplifying section 15 using the gain control signal based on the amplified transmit output data and the code-multiplexed transmit data, and thereby performs the gain compensation.

However, since the conventional transmission apparatus needs to average amplitude values of the amplified transmit output data and amplitude values of the code-multiplexed transmit data accumulated during a predetermined period of time, the apparatus has a problem that the calculation amount increases. Further, in the conventional transmission apparatus, when the number of codes to be multiplied increases, root-nyquist filter 13 undergoes a limiter limitation with a predetermined value with respect to the amplitude of the multiplexed transmit data, and thereby a problem occurs that accurate gain compensation becomes difficult.

DISCLOSURE OF INVENTION

It is an object of the present invention to provide a transmission apparatus and gain compensation method capable of performing a gain compensation with a small calculation amount and with high accuracy.

The object is achieved by adding redundant data with constant transmit power to transmit data using a time a signal is not transmitted, and performing the gain compensation based on a difference value between an amplitude value of amplified redundant data and a target amplitude value.

BRIEF DESCRIPTION OF DRAWINGS

FIG. 3A is a diagram illustrating code-multiplexed data output from a code multiplexing section in the transmission apparatus according to one embodiment of the present invention; and FIG. 3B is a diagram illustrating code-multiplexed data and redundant data output from a data adding section in the transmission apparatus according to one embodiment of the present invention.

BEST MODE FOR CARRYING OUT THE INVENTION

The inventor of the present invention focused on the fact that in the case of a TDD (Time Division Duplex) system, a signal is not transmitted during a time a signal is received, it is not necessary to transmit a signal used for the gain compensation to a communication partner, and that the constant transmit power of such a signal eliminates the necessity of averaging, and carried out the present invention.

Namely, it is a gist of the present invention to add redundant data with constant transmit power to transmit data using a time a signal is not transmitted, and to perform the gain compensation based on a difference value between an amplitude value of amplified redundant data and a target amplitude value.

An embodiment of the present invention will be described below with reference to accompanying drawings.

Figure 1:
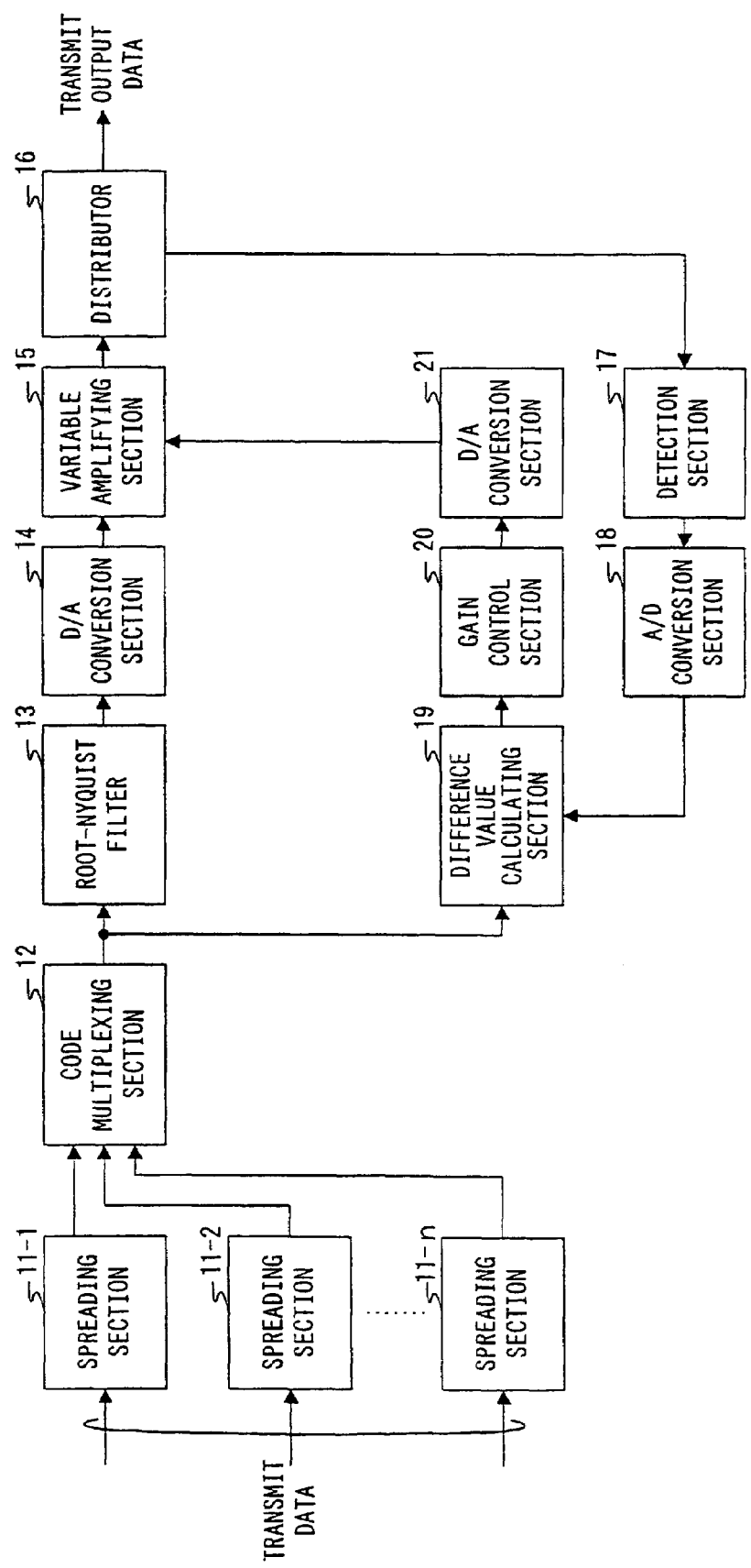
FIG. 1 is a block diagram illustrating a configuration of a conventional transmission apparatus.
Figure 2:
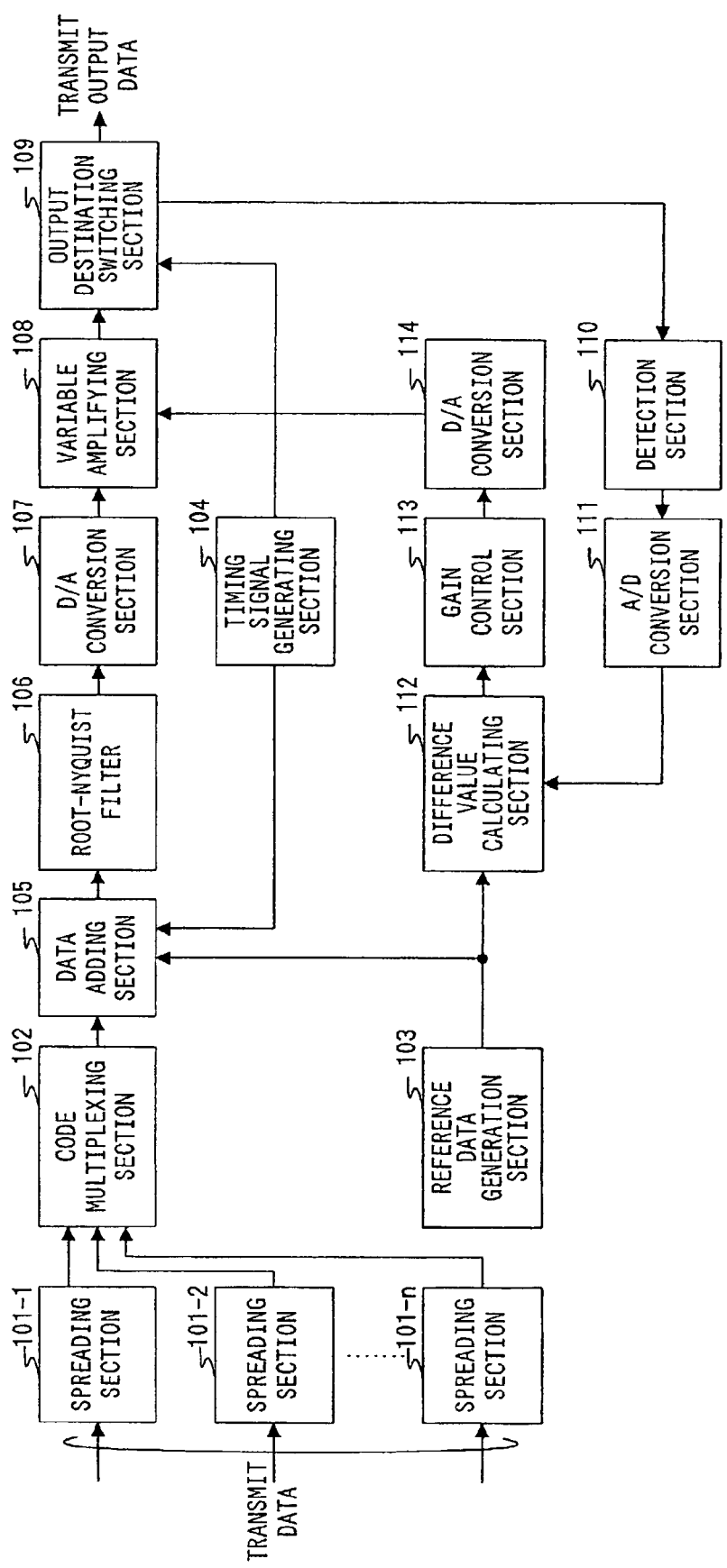
FIG. 2 is a block diagram illustrating a configuration of a transmission apparatus according to one embodiment of the present invention.

FIG. 2 is a block diagram illustrating a configuration of a transmission apparatus according to one embodiment of the present invention.

In the transmission apparatus in FIG. 2, spreading sections 101-1 to 101-n multiply respective transmit data by respective spreading codes different from each other to generate respective spread data. Code multiplexing section 102 multiplexes the respective spread data output from spreading sections 101-1 to 101-n to generate code-multiplexed data. It is thereby possible to spread the information on the frequency axis to multiplex a plurality of transmit channels in the same frequency band. The code-multiplexed data is output to data adding section 105.

Reference data generating section 103 generates redundant data with the constant transmit power and with no information contained therein. The redundant data is output to data adding section 105 and difference value calculating section 112.

Timing signal generating section 104 generates a timing signal which is a signal indicative of a timing for switching transmission and reception in the TDD system and is used as a reference for starting the operation in each section. The timing signal is output to data adding section 105 and output destination switching section 109.

Data adding section 105 adds the redundant data to the code-multiplexed data based on the timing signal. In the case of the TDD system, since a signal is not transmitted during the time a signal is received, data adding section 105 adds the redundant data during the time a signal is not transmitted.

Root-nyquist filter 106 rectifies an output signal of data adding section 105. D/A conversion section 107 converts the digital signal output from root-nyquist filter 106 into an analog signal.

Variable amplifying section 108 variably amplifies the transmit power of an output signal of D/A conversion section 107 based on a gain control signal output from D/A conversion section 114.

Output destination switching section 109 switches an output destination of transmit output data based on the timing signal. Specifically, the code-multiplexed data portion of the transmit output data is transmitted to communication partners, while the redundant data portion thereof is output to detection section 110.

Detection section 110 detects the redundant data portion of the transmit output data. A/D conversion section 111 converts the analog signal output from detection section 110 into a digital signal.

Difference value calculating section 112 calculates a difference value between a target amplitude value based on the redundant data generated in reference data generating section 103 and the redundant data portion of the transmit output data output from A/D conversion section 111.

Gain control section 113 generates based on the difference value the gain control signal for controlling the gain of variable amplifying section 108. In addition, the specific operations of difference value calculating section 112 and of gain control section 113 will be described later.

D/A conversion section 114 converts the gain control signal from the digital signal into the analog signal to output to variable amplifying section 108.

The operation of the transmission apparatus of this embodiment will be described next with reference to FIGS. 2 and 3.

Respective transmit data is multiplied by respective spreading codes in spreading sections 101-1 to 101-n, and is multiplexed in code multiplexing section 102, and code-multiplexed data is thereby generated. FIG. 3A illustrates code-multiplexed data 301 output from code multiplexing section 102. As illustrated in FIG. 3A, code-multiplexed data 301 does not have the constant transmit power. Further in the case of the TDD system, since code-multiplexed data 301 is transmitted intermittently, there exists a time period during which no data is transmitted.

Data adding section 105 adds the redundant data to the code-multiplexed data at a predetermined timing. FIG. 3B illustrates code-multiplexed data 301 and redundant data 302 output from data adding section 105. As illustrated in FIG. 3B, redundant data 302 is added to the time period during which no data is transmitted, and has the constant transmit power.

The code-multiplexed data and redundant data is converted in D/A conversion section 107 from the digital signal into the analog signal, and the analog signal is amplified in variable amplifying section 108 so that the amplitude value becomes a predetermined value.

The amplified redundant data is separated from the transmit data in output destination switching section 109, is detected in detection section 110, and is converted in A/D conversion section from the analog signal into the digital signal.

Difference value calculating section 112 calculates the difference value between the target amplitude value based on the amplitude value of the redundant data that is not amplified and the amplitude value of the amplified redundant data. Gain control section 113 generates the gain control signal for controlling variable amplifying section 109 so as to compensate for the difference. Controlling variable amplifying section 109 with the gain control signal is capable of compensating for the difference in the amplification gain.

The operations of difference value calculating section 112 and gain control section 113 will be specifically described below.

Difference value calculating section 112 calculates the target amplitude value based on the redundant data generated in reference data generating section 103. For example, when it is assumed that the amplitude value of the redundant data is 20 W and that variable amplifying section 108 amplifies a signal by twice, the target amplitude value is 40 W. Next, difference value calculating section 112 measures the amplitude value of the redundant data portion of the transmit output data output from A/D conversion section 111, and calculates the difference value between the target amplitude value and the redundant data portion of the transmit output data. For example, when the measurement is indicative of 38 W, the difference value is 2 W.

Gain control section 113 generates based on the difference value the gain control signal for controlling the gain of variable amplifying section 108. For example, when it is assumed that the target amplitude value is 40 W and that the difference value is 2 W, in order to compensate for the difference value, the section 113 generates the gain control signal for controlling so that the gain of variable amplifying section 108 becomes 42 W.

As is apparent from the description above, according to the present invention, redundant data with the constant transmit power is added to transmit data, and the gain compensation is performed based on the difference value between the amplitude value of the amplified redundant data and the target amplitude value, whereby it is not necessary to calculate the amplitude value of the transmit data and the average value of the detected output, and it is thereby possible to perform the gain compensation with a small calculation amount. Further, since it is possible to perform the gain compensation independently of the number of codes to be multiplexed and the amplitude value of the transmit data, it is possible to perform the gain compensation with high accuracy.

This application is based on the Japanese Patent Application No.2000-068428 filed on Mar. 13, 2000, entire content of which is expressly incorporated by reference herein.

Industrial Applicability

The present invention is suitable for use in base station apparatuses in a CDMA radio communication system.

What is claimed is:

1. A transmission apparatus for intermittently transmitting data in a TDD system, the transmission apparatus comprising:
   a data adder that inserts redundant data with constant power in a time period in which no transmit data is transmitted;
   a variable amplifier that variably amplifies transmit data and the redundant data; and
   a gain controller that controls a gain of the variable amplifier based on a target amplitude value and an amplitude value of the amplified redundant data.

2. The transmission apparatus according to claim 1, further comprising:
   a code multiplexer that multiplexes spread data, wherein the data adder adds the redundant data to the code-multiplexed data output from the code multiplexer.

3. The transmission apparatus according to claim 1, further comprising:
   a difference value calculator that calculates a difference value between the target amplitude value and the amplitude value of the amplified redundant data, wherein based on the difference value, the gain controller controls the gain of the variable amplifier.

4. The transmission apparatus according to claim 3, wherein the gain controller controls so that the gain of the variable amplifier is a value of a sum of the target amplitude value and the difference value.

5. A base station apparatus provided with a transmission apparatus for intermittently transmitting data in a TDD system, said transmission apparatus comprising:
   a data adder that inserts redundant data with constant power in a time period in which no transmit data is transmitted;
   a variable amplifier that variably amplifies transmit data and the redundant data; and
   a gain controller that controls a gain of the variable amplifier based on a target amplitude value and an amplitude value of the amplified redundant data.

6. A gain compensation method in a transmission apparatus for intermittently transmitting data in a TDD system, the method comprising:
   inserting redundant data with constant power in a time period in which no transmit data is transmitted;
   variably amplifying transmit data and the redundant data;
   calculating a difference value between a target amplitude value and an amplitude value of the amplified redundant data; and
   controlling an amplification gain based on the difference value.

* * * * *